(12) United States Patent
Ter Meulen et al.

(10) Patent No.: US 12,145,308 B2
(45) Date of Patent: *Nov. 19, 2024

(54) APPARATUS FOR A ROLL-TO-PLATE IMPRINTING PROCESS COMPRISING A PLATE CARRIER WITH COMPENSATING MATERIAL

(71) Applicant: Morphotonics Holding B.V., Veldhoven (NL)

(72) Inventors: Jan Matthijs Ter Meulen, Eindhoven (NL); Bram Johannes Titulaer, Veldhoven (NL); Adrianus Johannes Van Erven, Casteren (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 313 days.

This patent is subject to a terminal disclaimer.

(21) Appl. No.: 17/773,693

(22) PCT Filed: Nov. 11, 2020

(86) PCT No.: PCT/EP2020/081764
§ 371 (c)(1),
(2) Date: May 2, 2022

(87) PCT Pub. No.: WO2021/094374
PCT Pub. Date: May 20, 2021

(65) Prior Publication Data
US 2022/0379545 A1 Dec. 1, 2022

(30) Foreign Application Priority Data
Nov. 12, 2019 (EP) .................................. 19208428
Nov. 12, 2019 (EP) .................................. 19208429

(51) Int. Cl.
*B29C 59/04* (2006.01)
*B29C 59/00* (2006.01)

(52) U.S. Cl.
CPC .......... *B29C 59/046* (2013.01); *B29C 59/002* (2013.01); *B29K 2995/0046* (2013.01)

(58) Field of Classification Search
None
See application file for complete search history.

(56) References Cited

U.S. PATENT DOCUMENTS 7,824,516 B2 * 11/2010 Amos .................. B29C 39/148
156/247
2004/0219461 A1 11/2004 Chung
(Continued)

FOREIGN PATENT DOCUMENTS

JP 2016162870 A 9/2016
JP 2016197672 A 11/2016
(Continued)

OTHER PUBLICATIONS

PCT International Search Report for PCT Application No. PCT/EP2020/081764 mailed Mar. 4, 2021 (5 pages).
(Continued)

*Primary Examiner* — Yung-Sheng M Tsui
(74) *Attorney, Agent, or Firm* — Merchant & Gould P.C.

(57) ABSTRACT

An imprinting apparatus for a roll-to-plate process includes a flexible master (105), a plate carrier (101) and a substrate (102). The flexible master is pressable upon the substrate during the imprinting process and the plate carrier holds the substrate. The plate carrier includes a compensating material (114). The compensating material is larger than the area of the substrate and boundaries of the substrate and boundaries of the compensating material do not touch.

14 Claims, 12 Drawing Sheets

(56) References Cited

U.S. PATENT DOCUMENTS

2007/0243281 A1   10/2007  Hasegawa
2016/0257062 A1    9/2016  Ishikawa et al.
2017/0133638 A1*  5/2017  Takahashi ............... B32B 38/10

FOREIGN PATENT DOCUMENTS

JP      2016207950 A   12/2016
WO   2016/128493 A1   8/2016
WO   2018/011208 A1   1/2018

OTHER PUBLICATIONS

PCT Written Opinion for PCT Application No. PCT/EP2020/081764 mailed Mar. 4, 2021 (8 pages).
Japanese Office Action received for JP Application No. 2022-525696 on Jul. 18, 2024, 13 pgs.

* cited by examiner

APPARATUS FOR A ROLL-TO-PLATE IMPRINTING PROCESS COMPRISING A PLATE CARRIER WITH COMPENSATING MATERIAL

CROSS-REFERENCE TO RELATED APPLICATIONS

This application is a U.S. National Stage Application of PCT/EP2020/081764, filed 11 Nov. 2020, which claims benefit of Ser. Nos. 19/208,429.1 and 19208428.3, both filed 12 Nov. 2019 in Europe, and which applications are incorporated herein by reference. To the extent appropriate, a claim of priority is made to each of the above disclosed applications.

The Invention pertains to an imprinting apparatus for a roll-to-plate process.

Imprinting apparatus for a roll-to-plate process are known and comprise a roller, a flexible master with an imprint pattern, a plate carrier and a substrate. The substrate is located on the plate carrier. The flexible stamp carries an inverse structure (imprint pattern or relief structure), which is required for the desired product and the substrate and/or the flexible master contains a curable resin (also mentioned as lacquer). During the imprinting process the flexible master is pressed by use of a roller upon the substrate with the curable resin in between. During curing, the resin is solidified, e.g. by heat and/or UV, and after removing the flexible master, the solidified resin with the required product structure is transferred to remain on the substrate.

The roll-to-plate imprint process is a discrete imprint process. It differs from the continuous roll-to-roll imprint process. In the roll-to-roll process the counter pressure during imprinting is given by use of a second roller. In the roll-to-plate imprint process a plate carrier is used and the counter pressure is given by a plate carrier directly or indirectly via a lower imprint roller arranged under the plate carrier.

A plate carrier according to the invention is a kind of plate comprising a carrier surface, whereby the area of the carrier surface is larger than the thickness of the plate perpendicular to the carrier surface. The width and the length of the plate carrier is larger than the area of the substrate.

Known prior art for a roll-to-plate imprinting apparatus is for example described in WO 2016128493.

Document JP 2016 207 950 relates to an imprinting apparatus for forming a fine pattern. The aim is to improve the transfer quality of the fine pattern, whereby differences in thickness of a transfer target should be compensated during the manufacture process.

The term "flexible master" is used in the present invention for any device which is flexible and suitable as carrier for an imprinting pattern. Preferably, the flexible master is a flexible stamp or a flexible nickel shim.

With a roll-to-plate imprinting apparatus large area surfaces with resin on top can be imprinted for obtaining curable imprinted products. These large area surfaces can be transported or handled by use of large plate carriers. The purpose of the plate carrier is to guide and transport the substrate. Having the plate carrier can enable or facilitate the alignment of the flexible master and substrate. The plate carrier can also give counter pressure to the imprint roller. In a different setup the counter pressure is given by a lower imprint roller underneath the substrate and plate carrier.

The larger the plate carrier size, the more complex is the making of a flat surface of the plate carrier. If the plate carrier is not perfectly flat, the counter pressure on the substrate (which is located above the plate carrier) will be locally different during the imprint process in combination with the line pressure of the roller on top. This will result in local thickness variations on the end product. In addition, if the backside of the (large) substrate (which is in contact with the plate carrier) is not uniformly flat due to thickness variations, defects or contamination (for example a dust particle), there will be also pressure variations during the imprinting. Furthermore, also non-uniformities of the imprint roller result in pressure variations during the imprinting process. This all will result in a locally thinner or thicker residual layer thickness. A non-uniform backside surface of the substrate can thus result in visible defects at the front side of the substrate—this means the lacquer side—and influences the quality of the imprinted end-product.

A roll-to-roll imprinting process does not use a plate carrier. Roll-to-roll imprinting focuses on the production of textured films, not on the replication of textures on discrete substrates or products. Alignment of the flexible master to the product is not an issue within roll-to-roll imprinting.

It is thus the aim of the invention to compensate or at least to minimize the disadvantages of the prior art roll-to-plate imprinting apparatus.

This aim is achieved with an imprinting apparatus for a roll-to-plate process, whereby the plate carrier comprises a compensating material, whereby the substrate is located above the compensating material, whereby the area of the compensating material is larger than the area of the substrate and boundaries of the substrate and boundaries of the compensating material do not touch. Due to the use of a compensating material the disadvantages of a non-uniform flatness of the substrate and/or plate carrier and/or imprint roller can be mitigated or reduced by the compensating material.

The substrate lies at a distance from boundary regions of the compensating material above the compensation material. Preferably the distance of the boundaries of the substrate to the boundaries of the compensating material is at least 3 mm, preferred at least 0.5 cm, more preferred at least 3 cm, most preferred at least 5 cm and more most preferred at least 10 cm.

Boundary regions of the compensating material means the side faces and the edges of the compensating material. If a round shaped compensating material is used, the round shaped material has only one side face and the substrate is positioned in a distance to this one side face.

According to a first idea of the invention the dimension of the compensating material is larger than the dimension of the substrate and the substrate is located above the compensating material in a manner that the substrate has a distance to the side faces of the compensating material. This means, the boundaries of the substrate and the boundaries of the compensating material do not touch (each other). The substrate is located preferably in a center region of the compensating material and no side face of the substrate is in-line with a side face of the compensating material or the substrate protrudes beyond the compensating material. Aside of the substrate side carrier supports can be placed on same compensating material, or the side carrier supports can be made of a compensating material.

Especially for non-squared substrates the pressure over the substrate will vary because the layer underneath (for example the plate carrier) is not equally divided substrate and side carrier support. As example, in the beginning of a round wafer as substrate there is little compensating material, and the roller will not be able to bend. In the middle of the round wafer as substrate the roller might bend. Here the pressure on the substrate will be higher. If there is no compensating material underneath of the substrate and side support, the pressure will be equally in the middle and side of the round substrate. Therefore, a compensating material with a larger dimension than the substrate, whereby the substrate is located with a distance to the boundary regions of the compensating material is especially advantageous.

The aim is also achieved with an imprinting apparatus for a roll-to-plate process comprising a flexible master, a plate carrier and a substrate, whereby the flexible master is pressable upon the substrate during the imprinting process and the plate carrier holds the substrate, whereby the plate carrier comprises a compensating material in form of an additional layer comprising a fluid.

The term compensating material means every material, which has reversible pressure compensating properties. In one form of the invention the compensating material is a fluid. The fluid is present in form of an additional layer, which is preferably in direct conformal contact to the plate carrier. The term "direct contact" means, that the additional layer is in a mechanical contact to the plate carrier. For example, the additional layer is placed between the substrate and the plate carrier. In one preferred embodiment the fluid is a gas or a liquid. As gas, Argon, Nitrogen or air is preferred. Water, oil, acrylate fluid or curable acrylate fluid is a preferred liquid medium. In one further preferred embodiment the fluid is a viscoelastic fluid. An additional layer in form of fluid means that the fluid creates a layer made of the fluid itself or the fluid is filled into a wrapping and the substrate lies on the wrapping or the substrate lies on or in the fluid itself. Furthermore, the additional layer can also be a kind of cushion into which the fluid is filled. An additional layer in form of a fluid means not a kind of depression which is used to hold the substrate on place of the plate carrier during the imprinting process. Due to the fluid a kind of fluid bed is created, which is able to compensate different pressures variation during the imprinting process.

The fluid is present in the form of an additional layer, which is preferably in indirect conformal contact to the plate carrier. The fluid can be present in a container, to hold the fluid in place. As example the fluid is present in a bag, creating a balloon or waterbed which have a reversible pressure compensating properties. The fluid can be gas or a liquid.

In document JP 2016 20 7950 the use of suction holes is disclosed. Due to the suction holes the substrate held the position by suction. A layer made of a fluid is not created by the suction holes according to this document.

A kind of fluid system can be used to create a compensating material in form of an additional layer comprising a fluid like an airbed as compensating material, by which the substrate is mounted contactless while having a compensating counter pressure. In a further example the fluid system is used to create a liquid bed as compensating material, by which the substrate is mounted contactless while having a compensating counter pressure. The mentioned air bed and/or liquid bed can be present in a conformal container, forming a balloon or liquid bed, to hold the fluid in place.

In another form of the present invention the compensation material is a flexible material.

The term "flexible" means that the material can be reversible compressed. This means that the flexible material is elastic in comparison with glass or metal. Preferably the flexible material has a Young's Modulus between 0.1 Giga Pascal (GPa) and 10 Giga Pascal (GPa), more preferred a Young Modulus between 0.5 Giga Pascal and 5 Giga Pascal measured according to ASTM E111. As example the flexible material can be rubber, elastomers, fiber materials, EPDM, polychloroprene, polyurethane or other plastics or mixtures of the above-named materials.

Within this application a material is called a rigid material if it has a Young's Modulus above 50 GPa measured according to ASTM E111.

In one further preferred embodiment the compensating material has a shore value of below Shore A scale 80 measured according to ASTM D2240.

The substrate is located above the compensating material. The term "located above" means that the substrate is located above the compensating material in a direct or indirect contact (for example with a further layer in-between) above the compensation material. Due to a direct conformal contact between substrate and compensating material any unevenness can be followed and undesired effects can be reduced. In one preferred embodiment the substrate is embedded in the compensating material.

In one preferred embodiment the plate carrier has at least one cavity. The term "cavity" means any specific reduction or elevation of at least one segment of a storage area for the substrate of the plate carrier (see FIG. 5A, FIG. 5B and FIG. 5C). This includes for example a recess within the plate carrier comprising one or more side walls as well as a gap within the plate carrier in form of a groove or a frame structure. The storage area is part of the plate carrier and the area in which the substrate is located on or in the plate carrier.

Preferably, the substrate is located within the cavity of the plate carrier. Due to the at least one cavity the flexible master is guided over the substrate and the edges of the flexible master move over the plate carrier. Due to this carrier design the pressure of the flexible master upon the substrate is equally divided over the substrate.

In one preferred embodiment the cavity has a height which is approximately equal to the substrate thickness. For the understanding—the substrate has a propagation direction and the thickness of the substrate is perpendicular to that propagation direction. This means, the substrate has a surface on which the resin is imprinted, the thickness of the substrate is perpendicular to the imprint surface. Due to this preferred embodiment it is ensured that the entire surface of the substrate comes into contact with the flexible master, whereby a constant pressure is applied on the substrate.

In another preferred embodiment the cavity has a height which is approximately equal to the sum of the substrate thickness and the thickness of the flexible master. In this case the width of the flexible master is smaller than the width of the cavity, and the sides of the flexible master are positioned within the cavity. Also, in this embodiment it is ensured that the flexible master as well as the substrate has close and full surface contact to each other, with resin in between, whereby a constant pressure over the contact area is given.

It should be clear that on top of the substrate or on the flexible master a curable resin, also named lacquer, is present and the flexible master imprints structures into this resin. When, in the following it is mentioned that the flexible master comes into contact with the substrate it is meant that the pattern of the flexible master is transferred into the resin present on the substrate. Regarding the imprinting process and the further apparatus means of the imprinting apparatus reference is made to the document WO 2018/011208.

In one preferred embodiment the plate carrier is made of at least two parts—at least one first plate carrier part and at least one second plate carrier part.

Preferably, the first plate carrier part is made of a first material and the second plate carrier part is made of a second material, whereby the first material and the second material are different to each other. Preferably, at least one of the two parts of the plate carrier comprises or creates the compensating material. In one preferred embodiment the first plate carrier part has a fluid system, to create the air bed or liquid bed as compensating material and the second plate carrier part of the plate carrier is made of a rigid material. In another embodiment a flexible material comprises or creates the cavity. In one preferred embodiment for example the plate carrier is made of a first part of a glass material and a second part of a flexible material, whereby a cavity is part of the second part. Due to the use of two parts, whereby both parts may be made of different materials, the stability of the plate carrier will not be reduced even if the flexibility is increased.

Preferably, the first plate carrier part and/or the second plate carrier part is made of the compensating material. "Made of" means the carrier part is nearly to 100% made of the compensating material. For example, the plate carrier is made of an inflexible material (glass) as a first plate carrier part and made of a flexible material as the second plate carrier part. If a cavity is present—the cavity may be part of the first part or the second part or extend over both parts. In the case the compensating material is a fluid, the plate carrier might be a combination of a first plate carrier part comprising a more rigid base plate with a second plate carrier part comprising a fluid system to create the air or liquid compensating material layer.

In one further preferred embodiment the compensating material is reversibly connectable to the plate carrier, preferably a flexible material is reversible connectable to the plate carrier. Preferably, the compensating material (preferred a flexible material) is reversibly connectable to the first plate carrier part and/or to the second plate carrier part. Preferably, the compensating material is a flexible material in the form of a flexible mat. This flexible mat is laid down on the plate carrier—for example in the cavity of the plate carrier. In this example the flexible mat may go beyond the cavity or is bound by the cavity.

Preferably, the at least two parts of the plate carrier (first plate carrier part and second plate carrier part) are reversibly connectable with each other. "Reversibly connectable" means that both parts can be separated from each other without destroying any one of the parts. The connection between both parts can be achieved via a vacuum system, an adhesive surface on one or both parts, through a glue and/or through a plug connection (like a rail system or positioning pins) and/or via a screw system and/or magnetically or a combination of the above-named systems. Due to the two-part construction of the plate carrier, it is easy to adapt the plate carrier to different substrate thicknesses (resin thicknesses) or flexible master thicknesses. In addition, by using a flexible material as one part, this part has a higher wear resistance than a part made of an inflexible material. Thus, only one part of the plate carrier has to be replaced (instead of a complete plate carrier).

In one preferred embodiment the first plate carrier part and/or the second plate carrier part has/have a frame structure for the substrate. In one preferred embodiment the cavity equals the form of the substrate. "Equals the form" in this context means, that the cavity is not round, for example, and the substrate is angular. Preferably, the cavity forms a kind of pocket in which the substrate can be inserted. In this embodiment the substrate is protected on all side areas of the substrate via the plate carrier during the imprinting process. It is also possible to dimension the cavity in such a way that the substrate lies in a form-fit way within the plate carrier and thus to avoid slippage during the imprinting process. However, it is also conceivable that the cavity is formed as a kind of wide groove extending over the entire plate carrier.

In one preferred embodiment the plate carrier contains the first plate carrier part and the second plate carrier part in a thickness ratio of 3:1.

In one preferred embodiment a fluid flow system is located on or in the plate carrier, this should not be confused with the compensating material in form of an additional layer comprising a fluid. The fluid flow system can be on the first plate carrier part, to hold or mount the second plate carrier part and/or on the second plate carrier part to hold or mount the substrate. The cavity or flat top surface of the plate carrier may have, for example, vacuum holes through which a lower pressure can be generated. The vacuum will hold the substrate at a defined position within the cavity and will thus improve the imprinting process.

In one further preferred embodiment the plate carrier comprises a placement system. The placement system comprises preferably lifting fingers and/or pushers by means of which the substrate can always be placed at the same position within the cavity for instance by use of a robot.

In one preferred embodiment a substrate positioning system is located on the plate carrier. For example, alignment pins can be added on the second plate carrier part surface or within the cavity. The alignment pins can alter the substrate position. As a result, the process accuracy can advantageously be increased, because the imprinting process will start always at the same point of a substrate.

All embodiments mentioned for the imprinting apparatus are also applicable to a roll-to-plate processes.

In the following the idea of this invention is further described by figures.

Figure 1:
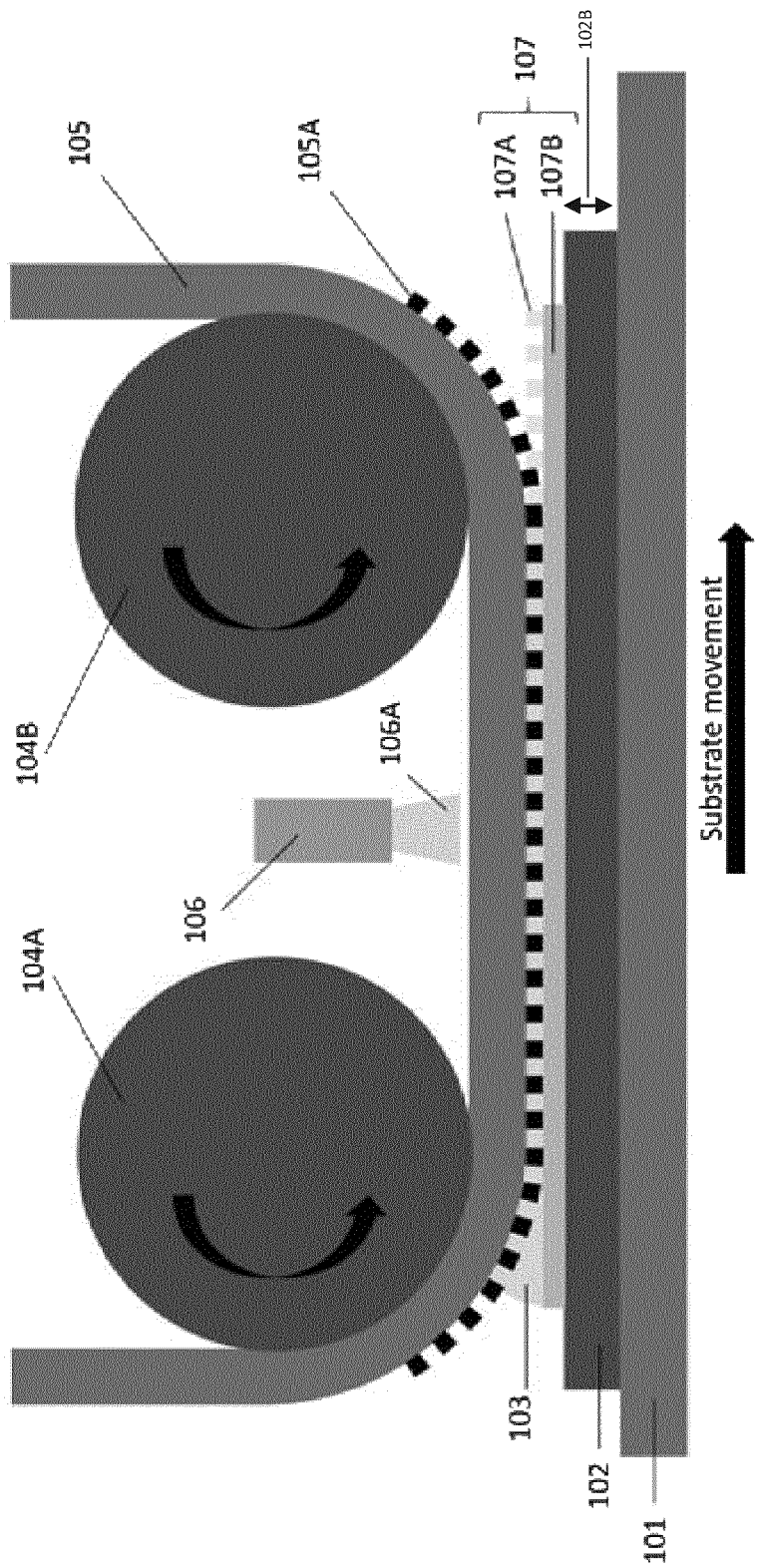
FIG. 1 shows schematically a roll-to-plate imprint process.

FIG. 1 shows an imprint setup and imprint process. A flexible master 105, having an imprinting pattern 105A with the inverse structure (negative) as required for the product texture, is pressed upon a curable resin 103 located on a substrate 102 by use of an imprint roller 104A. The substrate 102, with substrate thickness 102B, is a plate—for example but not limited made of rigid glass—and can have different shapes. This substrate 102 is placed on a plate carrier 101 to enable transportation or alignment and possibly a counter-pressure. The plate carrier 101 can be, amongst others be made from glass or a metal. After curing the resin 103 by use of UV light 106A from the UV-light source 106, the flexible master 105 is delaminated by delamination roller 104B and the cured resin 107, having the required product texture 107A and residual layer 107B underneath, is transferred on to the substrate 102.

Figure 2A:
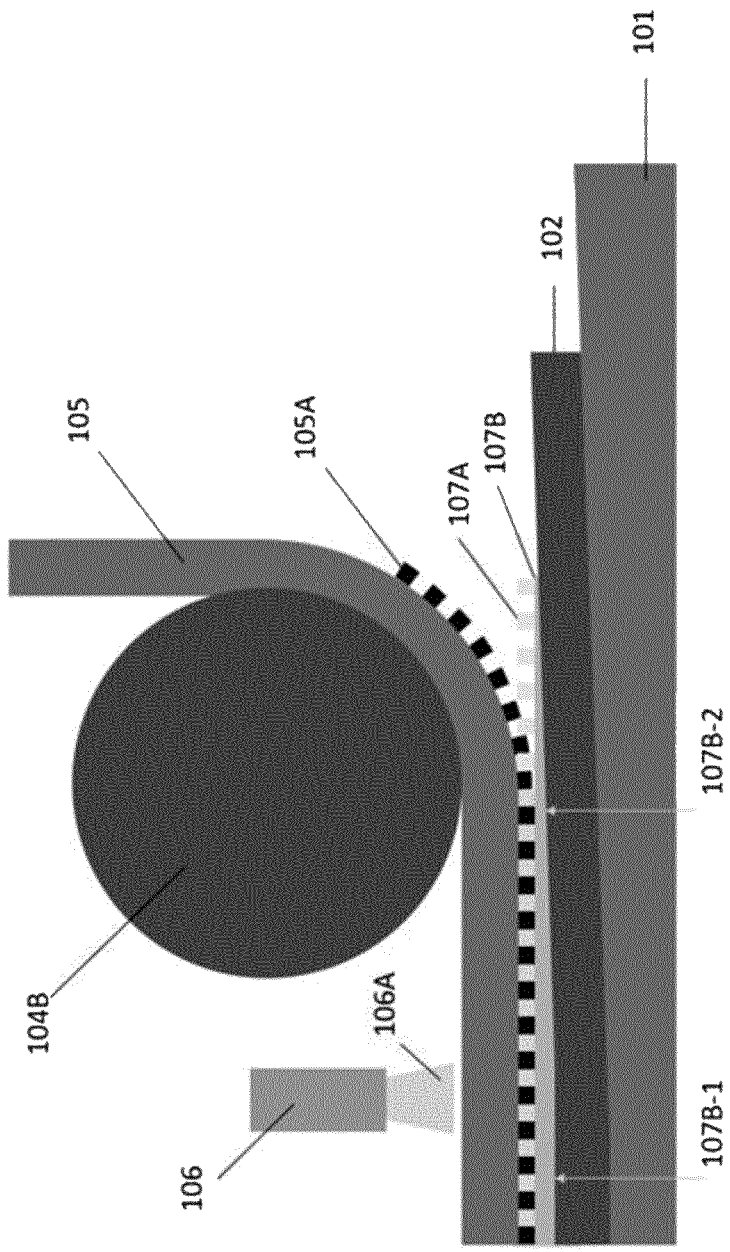
FIG. 2 shows schematically disturbances within the imprint process resulting in an inhomogeneous residual layer thickness.

In FIG. 2 different examples are shown, with disturbances within the imprint process, resulting in a non-uniform residual layer thickness. In FIG. 2A, a residual layer thickness 107B will locally differ due to an unevenness of the plate carrier 101. The imprinting pattern 105A of the flexible master 105 is transferred into the resin 103. Due to the unevenness of the plate carrier 101, the imprinting pattern 105A in the cured resin 107 will locally differ having a varying residual layer thickness 107B-1 and 107B-2 on the substrate 102.

Figure 2B:
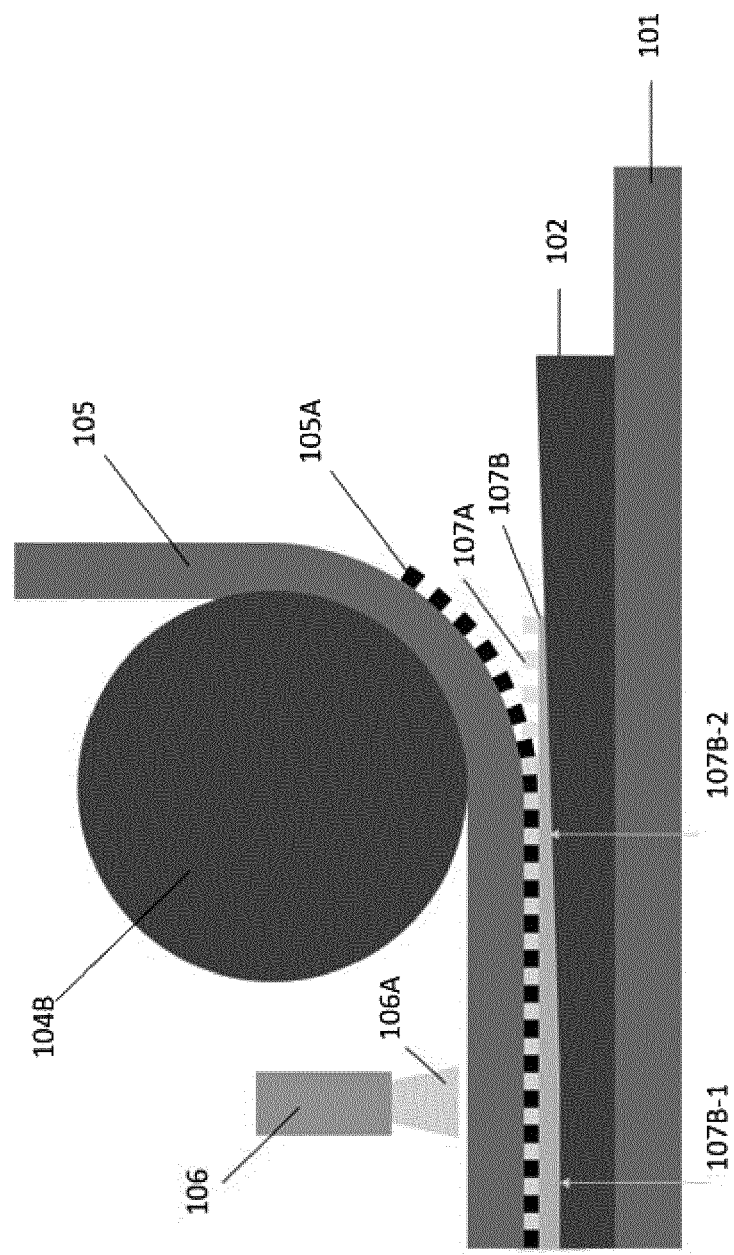

In FIG. 2B the unevenness is caused by a non-uniform substrate 102 thickness. As an example, non-uniform tempered glass is used as substrate 102. Pressure differences due to this substrate unevenness will result in different residual layer thickness 107B-1 and 107B-2.

Figure 2C:
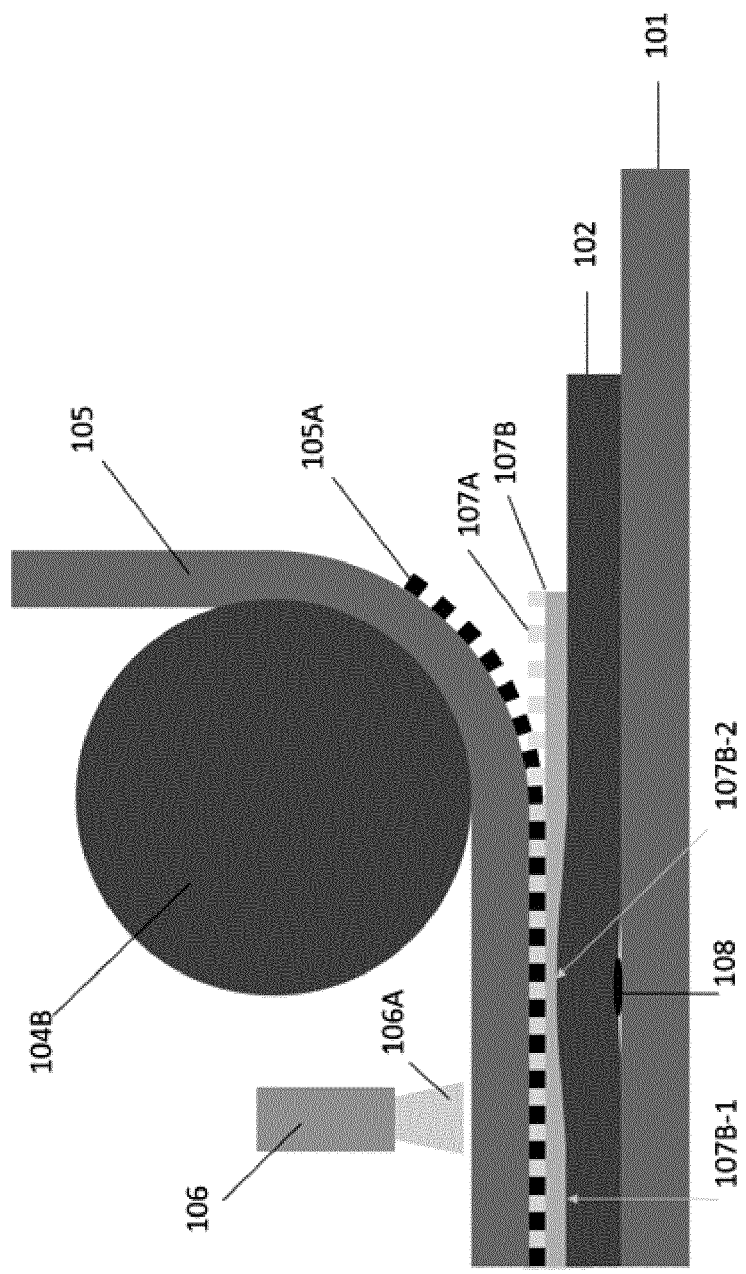

In FIG. 2C the unevenness is caused by contamination (for example, a speck of dust). Defects and particles 108 underneath the substrate 102 will raise the substrate 102 locally. Pressure differences due to this unevenness will result in different residual layer thickness 107B-1 and 107B-2.

Figure 3A:
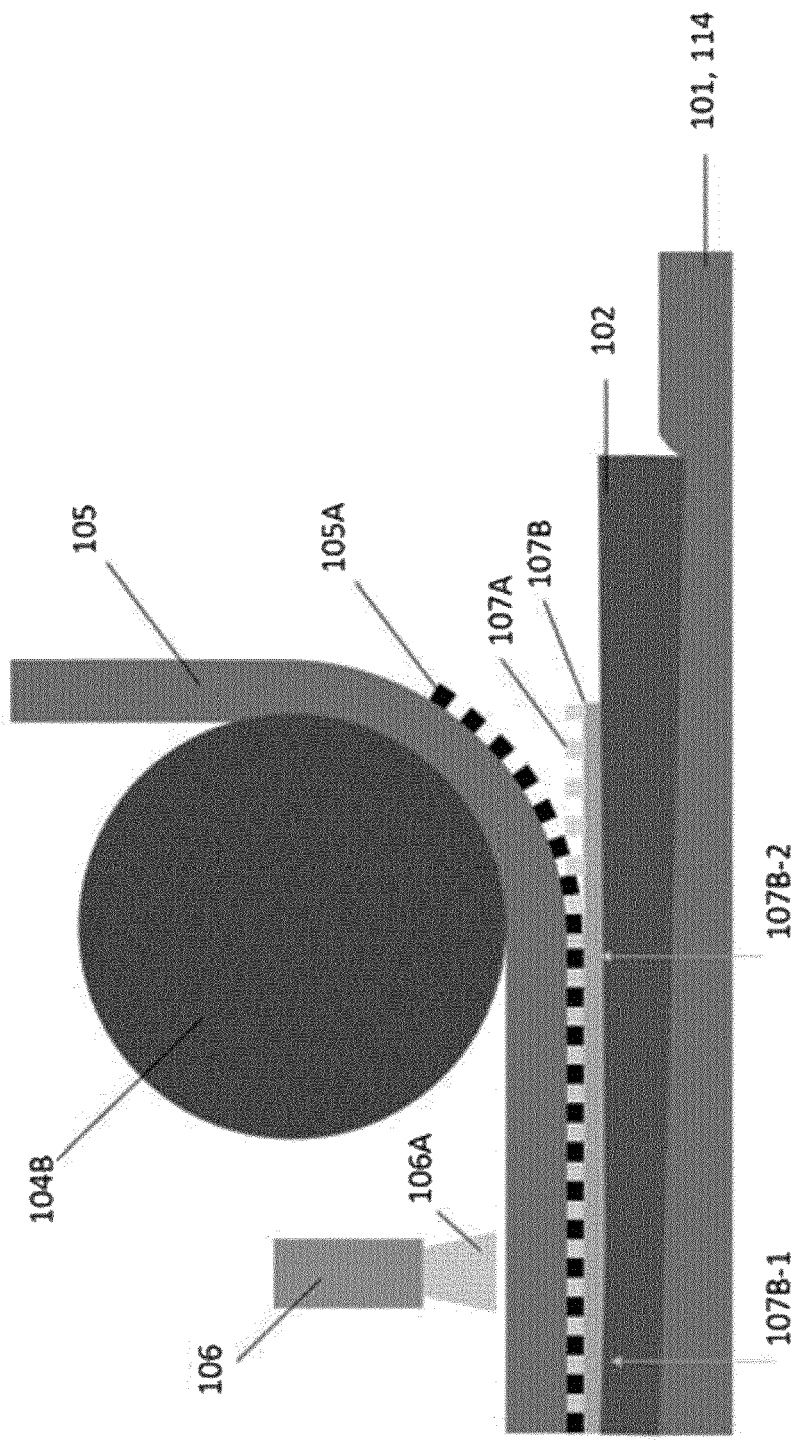
FIG. 3 shows schematically a limited impact of the disturbances in the case of a flexible imprint carrier.
Figure 3B:
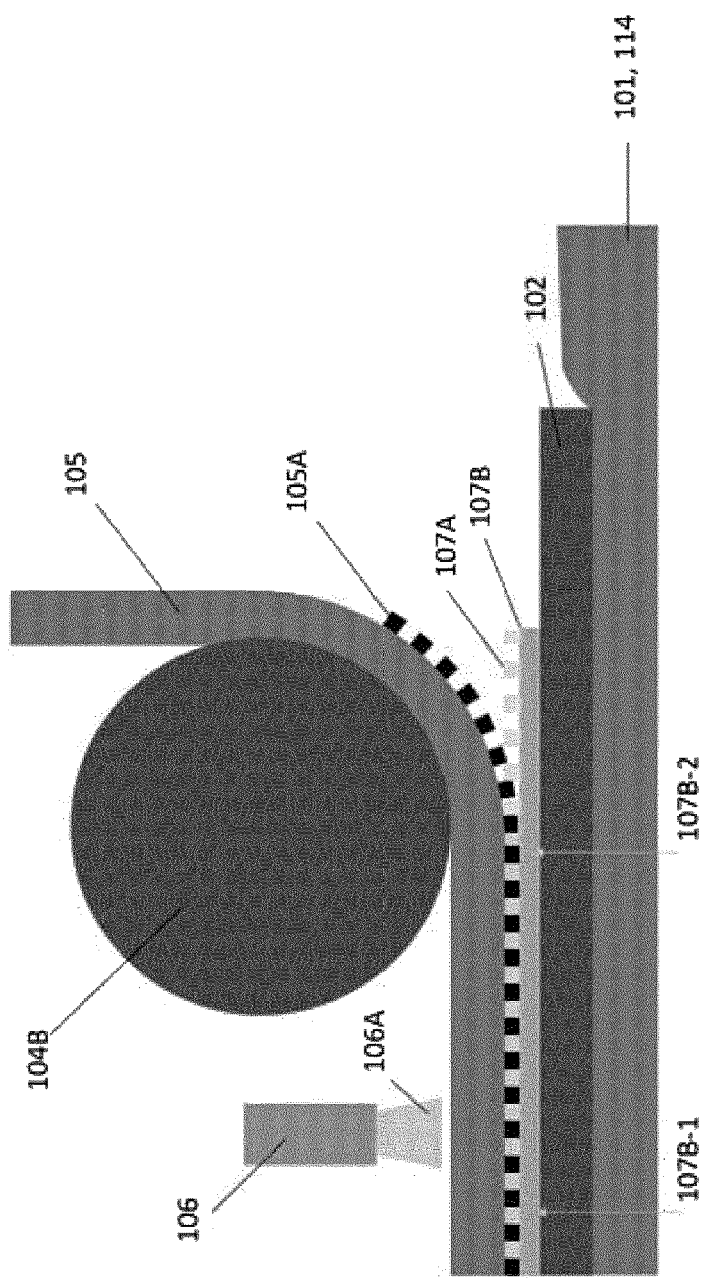
Figure 3C:
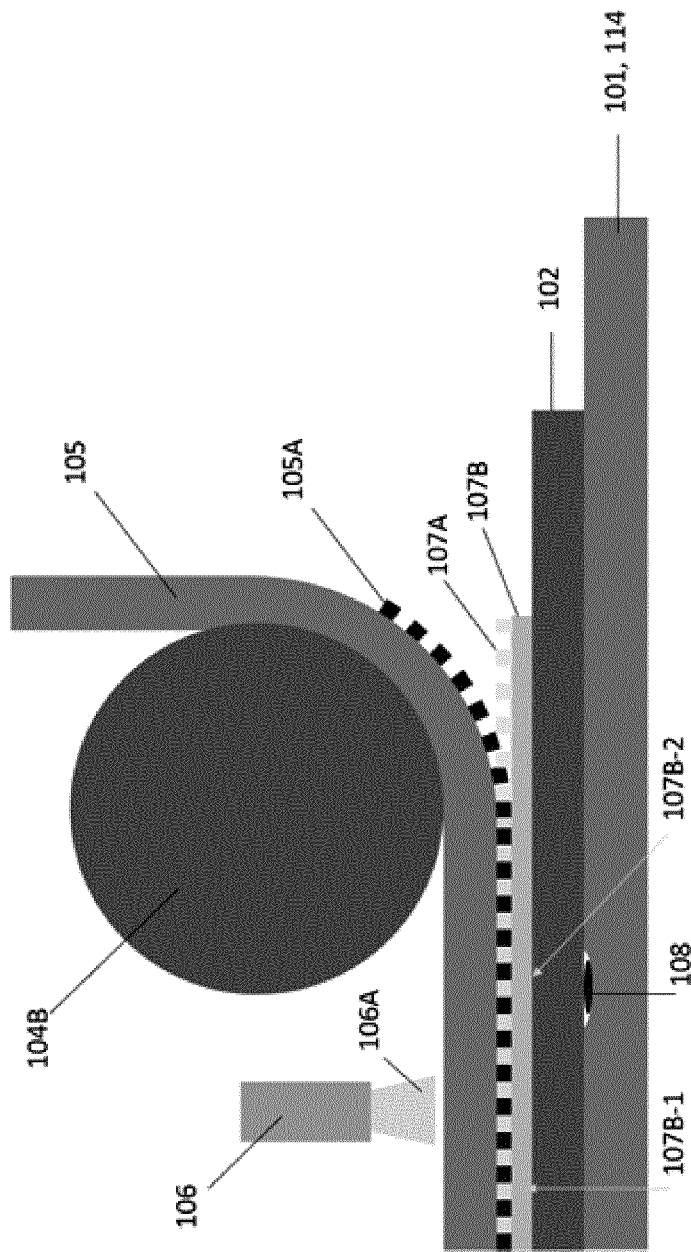

FIG. 3 shows the positive effect of a plate carrier 101 comprising a compensating material, for example a flexible material 114. The flexible material 114 will absorb local pressure increases. The increased pressure will compress the flexible material 114 of the plate carrier 101 by which the residual layer thickness 107B remains constant. FIG. 3A and FIG. 3B show the compression of the plate carrier 101, made of flexible material 114 (so-called flexible plate carrier 101) as one embodiment for a compensating material, underneath the substrate 102. FIG. 3A shows the compensation of the non-uniform plate carrier thickness 101, which can be compensated for once being made of compensating material 114. In case of FIG. 3B the non-uniform substrate thickness 102 is compensated in the compensating material 114. FIG. 3C shows the local compression of the flexible plate carrier 101, due to a defect 108. Because the unevenness 108 is compensated due to the flexible material 114 of plate carrier part 100, the flexible master pattern 105A of the flexible master 105 is transferred correct in the cured resin 107. In all embodiments of FIG. 3 is shown, that the dimension of the compensating material 114 is larger than the dimension of the substrate 102 and the substrate 102 is position in a distance to the edges of the compensating material 114. This means, the substrate 102 lies in a center region of the compensating material 114 and not in a boundary area and in-line with a side face of the compensating material 114 below.

In the case the plate carrier 101 is not needed to give counter pressure (i.e. a stage or second roller underneath the plate carrier 101 is used to give counterpressure), the plate carrier 101 can be made fully out of a compensating material, preferred a flexible material 114 (flexible plate carrier). In this case it will be more complex to add carrier functionalities as loading/unloading or alignment mechanisms.

Figure 4:
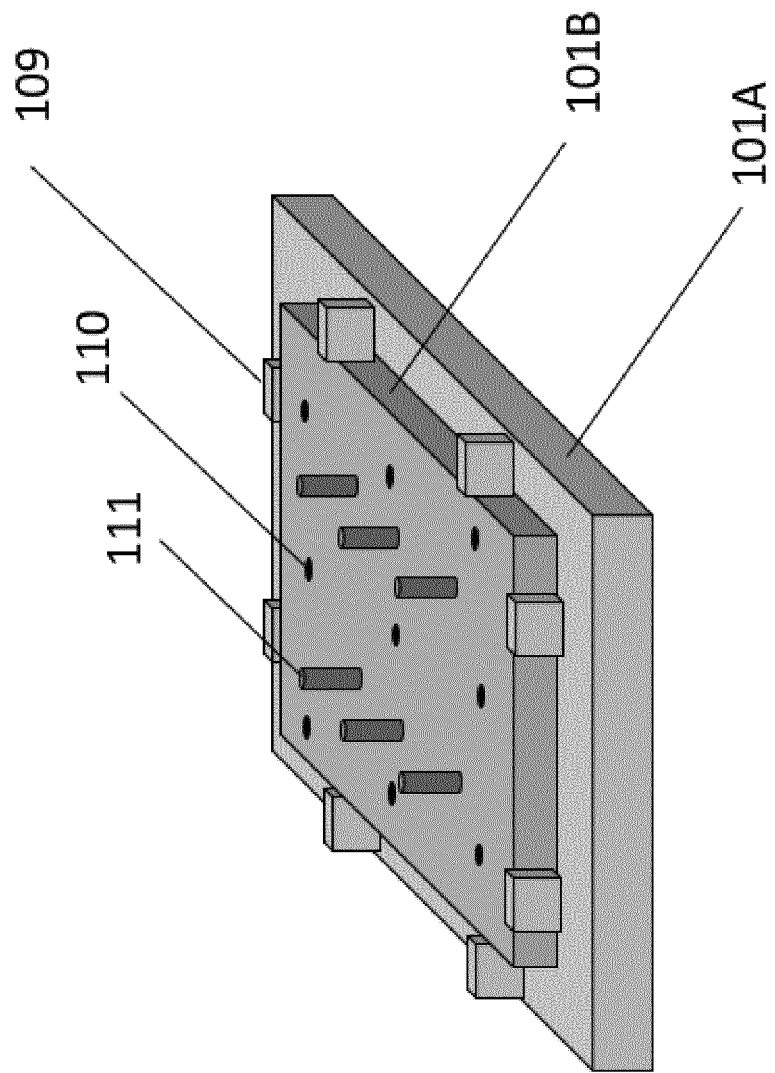
FIG. 4 shows schematically a design of a plate carrier.

FIG. 4 shows different designs of the plate carrier 101 build out of two parts. As shown the plate carrier 101 has a first plate carrier part 101A and a second plate carrier part 101B. This second plate carrier part 101B can be fixed on the first plate carrier part 101A. The fixation is removable or inseparable (without destroying one part). FIG. 4 shows a carrier design having vacuum holes 110 to hold the substrate 102 steady during imprinting. FIG. 4 shows lifting fingers 111 which can move up and downwards. In the upside position a substrate 102 can be placed, for instance by use of a robot. The substrate 102 is placed on the plate carrier 101 once the lifting fingers 111 are lowered. And FIG. 4 shows a positioning alignment system 109, made of positioning pins which can move inward and outward to allow for substrate 102 placement, with pins placed outwards, and aligned positioning after the pins have moved inwards. This second plate carrier part 101B can be made of a flexible material 114 (not shown in this figure). As example this second plate carrier 101B can be a flexible mat. In a second example the second plate carrier part 101B can be a fluid system creating an air bed or liquid bed to create a compensating layer.

FIG. 5 shows different configurations of a plate carrier 101 comprising a cavity 112. This cavity 112 can be used to create an uniform imprint pressure over the substrate 102, placed within the cavity 112. In this case the cavity height (see FIG. 1) is an important control parameter. For a flexible master 105 being wider as the width of the cavity 112, the height of the cavity 112 should be approximately the same as the height of the substrate 102B (not drawn in FIG. 5). For a flexible master 105 which fits and is placed within the cavity 112, being smaller as the width of the cavity 112, the height of the cavity 112 should be the sum of the substrate height and the thickness of the flexible master 105. The cavity 112 can be squared, rectangular, can have a groove shape or have exact same shape as the substrate 102.

Figure 5A:
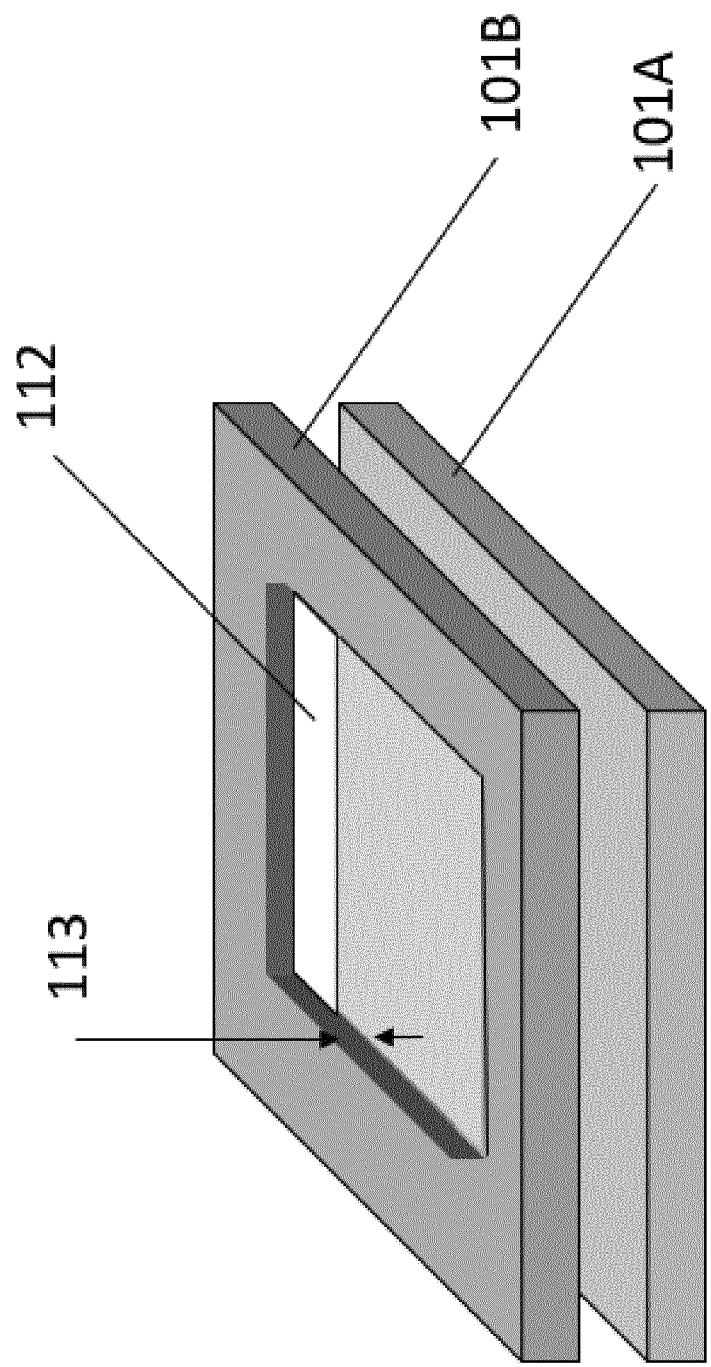
FIG. 5A shows schematically a configuration of a plate carrier
Figure 5B:
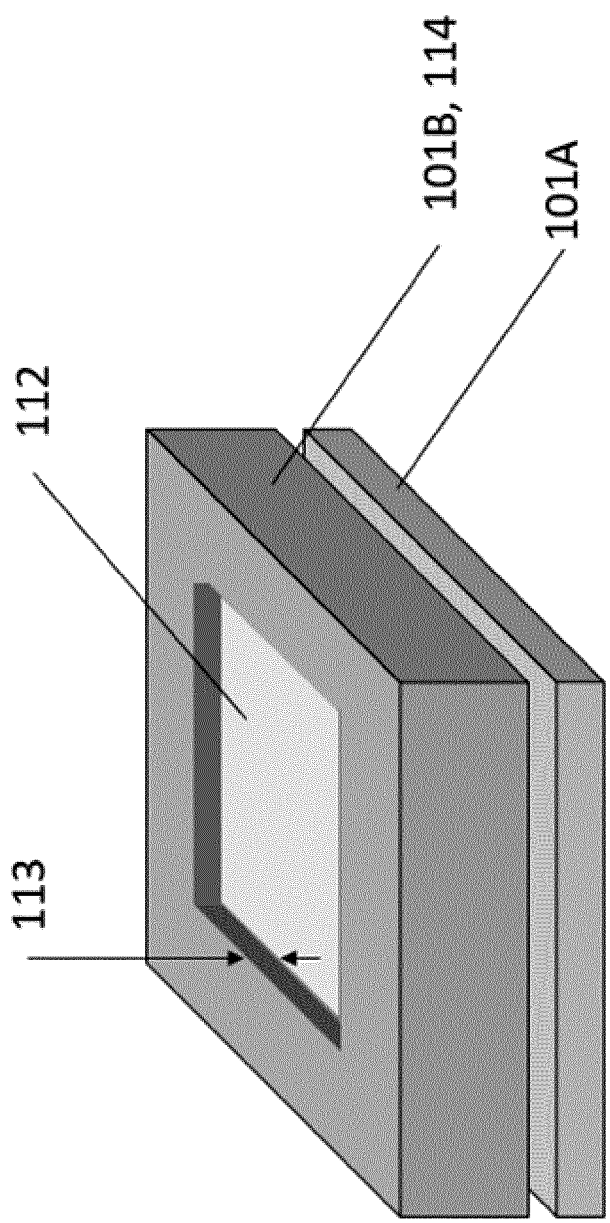
FIG. 5B shows schematically a plate carrier comprising a cavity in pocket form.

The plate carrier 101 in FIG. 5A and FIG. 5B are constructed in a two-part form comprising a first plate carrier part 101A and a second plate carrier part 101B. The cavity 112 is located in the second part 101B. The materials of the first plate carrier part 101A can be same or different from the second plate carrier part 101B. Both can be made from the same flexible material 114 as for instance rubber. In most cases the first plate carrier part 101A will be made from a different material compared to the second plate carrier part 101B. As example the first plate carrier part 101A can be made from a rigid material, as example, glass or metal or a material with a higher stiffness, as example rubber with a shore above 100, while the second plate carrier part 101B is made of a more flexible material, or a fluid film.

In FIG. 5A, the cavity 112 to place the substrate 102, located within the second plate carrier part 101B, is open. The substrate 102 will be placed on the first plate carrier part 101A. In this case it is preferred that the material of the first plate carrier part 101A is made of a compensating material, while the second plate carrier part 101B is made of same compensating material or a more rigid and less flexible material. As example 101A and 101B can both be made of rubber. In another example the first plate carrier part 101A has a fluid system to create a compensating material in the form of an air bed or water bed, while the second plate carrier part 101B is a more rigid holder.

In FIG. 5B the cavity 112 to place the substrate 102 is fully enclosed by the material of the second plate carrier part 101B. In this case it is preferred that the material of the second plate carrier part 101B is flexible, using flexible material 114.

Figure 5C:
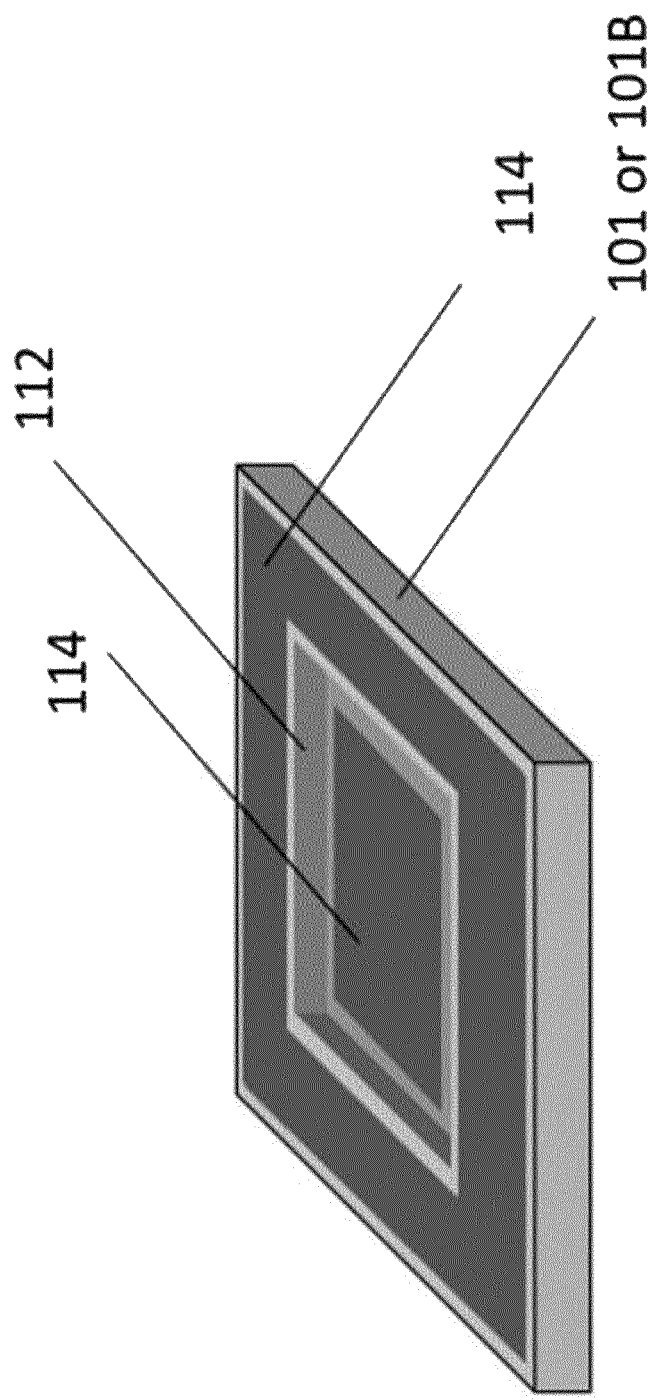
FIG. 5C shows schematically a plate carrier comprising a first and a second part.

In FIG. 5C the plate carrier 101 comprises a cavity 112, whereby a flexible material 114 is located inside of the cavity 112. In this embodiment the plate carrier 101 is made of a more rigid material. If the backside of the substrate 101 is not uniformly flat due to defects or thickness variations, there will be pressure variations during imprinting. This will result in a locally thinner residual layer thickness of the resin. A non-uniform backside pattern will be visible at the frontside of the imprinted product. Due to the use of a flexible material 114 placed on the inside of the cavity 112, this effect can also be avoided or reduced. The flexible material 114 can be thin sheets of rubber or plastic foils.

Preferably the flexible material 114 is not only place within the cavity 112, but also on the upstanding sides around the cavity 112.

Figure 6:
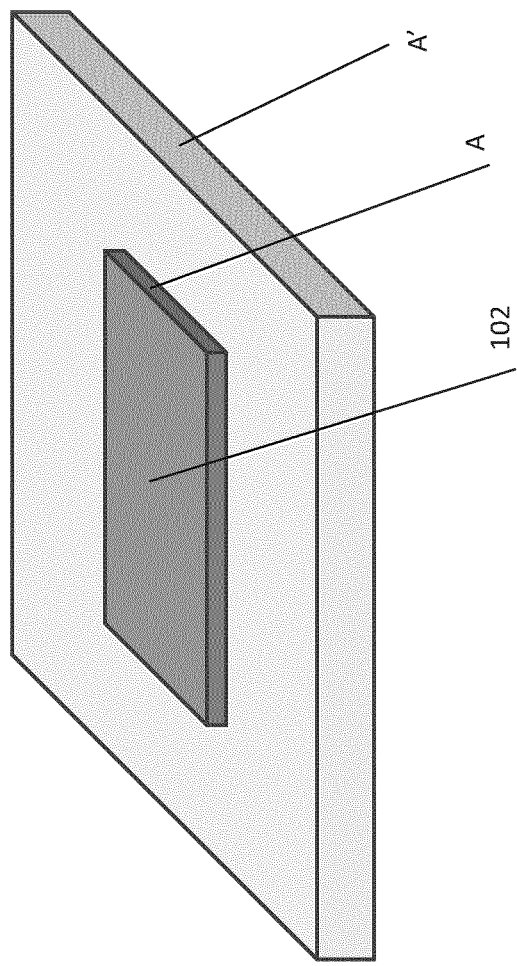
FIG. 6 shows a substrate located in a distance from boundary regions of a compensating material above the compensating material.

In FIG. 6 a substrate 102 lies at a distance from boundary regions of the compensating material above the compensating material. The boundary regions result from the side faces A' of the compensating material. The substrate 102 is located in a distance to the boundary regions, if none side face A of the substrate is in-line and arrange above the side faces A' of the compensating material. The distance between the side faces A of the substrate and the side faces of the compensating material A' may be for all side faces the same or different.

The invention claimed is:

1. Imprinting apparatus for a roll-to-plate process comprising a flexible master, a plate carrier and a substrate, wherein the flexible master is pressable upon the substrate during the an imprinting process and the plate carrier holds the substrate, wherein the plate carrier comprises a flexible mat compensating material, wherein the substrate is located above the compensating material, wherein an area of the compensating material is larger than the an area of the substrate and boundaries of the substrate and boundaries of the compensating material do not touch.

2. Imprinting apparatus for a roll-to-plate process comprising a flexible master, a plate carrier and a substrate, wherein the flexible master is pressable upon the substrate during the imprinting process and the plate carrier holds the substrate, wherein the plate carrier comprises a compensating material in form of an additional layer comprising a fluid.

3. The imprinting apparatus according to claim 1, wherein the compensating material is a flexible material.

4. The imprinting apparatus according to claim 1, wherein the plate carrier has at least one cavity wherein the substrate is locatable.

5. The imprinting apparatus according to claim 1, wherein the substrate is embeddable in the compensating material.

6. The imprinting apparatus according to claim 1, wherein the plate carrier comprises at least one first plate carrier part and at least one second plate carrier part, whereby wherein the first and/or second plate carrier part comprises the compensating material.

7. The imprinting apparatus according to claim 6, wherein the first pate carrier part is made of a first material and the second plate carrier part is made of a second material, wherein the first material and the second material are different to each other.

8. The imprinting apparatus according to claim 6, wherein the first plate carrier part is reversibly contactable via connecting means to the second plate carrier part.

9. The imprinting apparatus according to claim 1, wherein the plate carrier is made of the compensating material.

10. The imprinting apparatus according claim 6, wherein the first plate carrier part or the second plate carrier part is made of the compensating material.

11. The imprinting apparatus according to claim 6, wherein the compensating material is reversibly connectable to the first plate carrier part and/or the second plate carrier part.

12. The imprinting apparatus according to claim 3, wherein the compensating material is a flexible material having a Young's Modulus between 0.1 Giga Pascal (GPa) and 10 Giga Pascal (GPa) measured according to ASTM E111.

13. The imprinting apparatus according to claim 3, wherein the compensating material has a shore A value of below 80 measured according to ASTM D2240.

14. The imprinting apparatus according to claim 2, wherein the fluid is either Argon gas, Nitrogen gas, air, or a viscoelastic fluid.

* * * * *